US009899525B2

(12) United States Patent
Basker et al.

(10) Patent No.: US 9,899,525 B2
(45) Date of Patent: Feb. 20, 2018

(54) INCREASED CONTACT AREA FOR FINFETS

(71) Applicant: GLOBALFOUNDRIES INC., Grand Cayman (KY)

(72) Inventors: Veeraraghavan S. Basker, Schenectady, NY (US); Chung-Hsun Lin, White Plains, NY (US); Zuoguang Liu, Schenectady, NY (US); Tenko Yamashita, Schenectady, NY (US); Chun-Chen Yeh, Clifton Park, NY (US)

(73) Assignee: GLOBALFOUNDRIES INC., Grand Cayman, KY (US)

( * ) Notice: Subject to any disclaimer, the term of this patent is extended or adjusted under 35 U.S.C. 154(b) by 0 days.

(21) Appl. No.: 15/592,597

(22) Filed: May 11, 2017

(65) Prior Publication Data

US 2017/0250285 A1    Aug. 31, 2017

Related U.S. Application Data

(62) Division of application No. 14/794,997, filed on Jul. 9, 2015, now Pat. No. 9,680,020.

(51) Int. Cl.
*H01L 29/78*   (2006.01)
*H01L 29/66*   (2006.01)
(Continued)

(52) U.S. Cl.
CPC .... *H01L 29/7851* (2013.01); *H01L 21/31111* (2013.01); *H01L 21/823418* (2013.01);
(Continued)

(58) Field of Classification Search
CPC ............. H01L 29/66795; H01L 29/785; H01L 21/823431; H01L 21/823821; H01L 29/66545; H01L 27/0924; H01L 29/7853
(Continued)

(56) References Cited

U.S. PATENT DOCUMENTS 7,456,476 B2    11/2008  Hareland et al.
7,915,693 B2     3/2011  Okano
(Continued)

OTHER PUBLICATIONS

Nainani, A. et al., "Is strain enfineering scalable in FinFET era?: teaching the old dog some new tricks," IFEE International Electron Devices Meeting (IEDM), Dec. 2012 (pp. 1-4).
(Continued)

*Primary Examiner* — Jonathan Han
(74) *Attorney, Agent, or Firm* — Yuanmin Cai; Hoffman Warnick LLC

(57) ABSTRACT

This disclosure relates to a fin field effect transistor including a gate structure formed on a fin. Source and drain (S/D) regions are epitaxially grown on the fin adjacent to the gate structure. The S/D regions include a diamond-shaped cross section wherein the diamond-shaped cross section includes: internal sidewalls where the fin was recessed to a reduced height, and an external top portion of the diamond-shaped cross section of the S/D regions. A contact liner is formed over the internal sidewalls and the top portion of the diamond-shaped cross section of the S/D regions; and contacts are formed over the contact liner and over the internal sidewalls and the top portion of the diamond-shaped cross section of the S/D regions.

8 Claims, 12 Drawing Sheets

(51) Int. Cl.
   *H01L 21/311* (2006.01)
   *H01L 21/8234* (2006.01)
   *H01L 29/08* (2006.01)
   *H01L 29/417* (2006.01)

(52) U.S. Cl.
   CPC ............. *H01L 21/823431* (2013.01); *H01L 21/823475* (2013.01); *H01L 29/0847* (2013.01); *H01L 29/41791* (2013.01); *H01L 29/66545* (2013.01)

(58) Field of Classification Search
   USPC ................. 257/401, 288, E29.55, E21.09
   See application file for complete search history.

(56) References Cited

U.S. PATENT DOCUMENTS

| | | | |
|---|---|---|---|
| 8,258,577 B2 | 9/2012 | Dixit | |
| 8,263,451 B2* | 9/2012 | Su | H01L 29/785 257/190 |
| 8,362,574 B2 | 1/2013 | Kawasaki et al. | |
| 8,841,189 B1 | 9/2014 | Cheng et al. | |
| 8,859,379 B2 | 10/2014 | Cheng et al. | |
| 8,921,191 B2 | 12/2014 | Cai et al. | |
| 9,123,826 B1 | 9/2015 | Harley et al. | |
| 9,379,025 B1* | 6/2016 | Basker | H01L 21/823821 |
| 2011/0147840 A1 | 6/2011 | Cea et al. | |
| 2013/0187228 A1 | 7/2013 | Xie et al. | |
| 2014/0001520 A1* | 1/2014 | Glass | H01L 29/66439 257/288 |
| 2014/0131777 A1* | 5/2014 | Wong | H01L 21/04 257/288 |
| 2015/0137181 A1 | 5/2015 | Basker et al. | |
| 2015/0279840 A1 | 10/2015 | Huang et al. | |
| 2015/0295089 A1 | 10/2015 | Huang et al. | |

OTHER PUBLICATIONS

Rooyackers, R. et al., "Doubling or quadrupling MuGFET fin intergration scheme with higher pattern fidelity, lower CD variation and higher layout efficiency," International Electron Devices Meeting, Dec. 2006. (pp. 1-4).

* cited by examiner

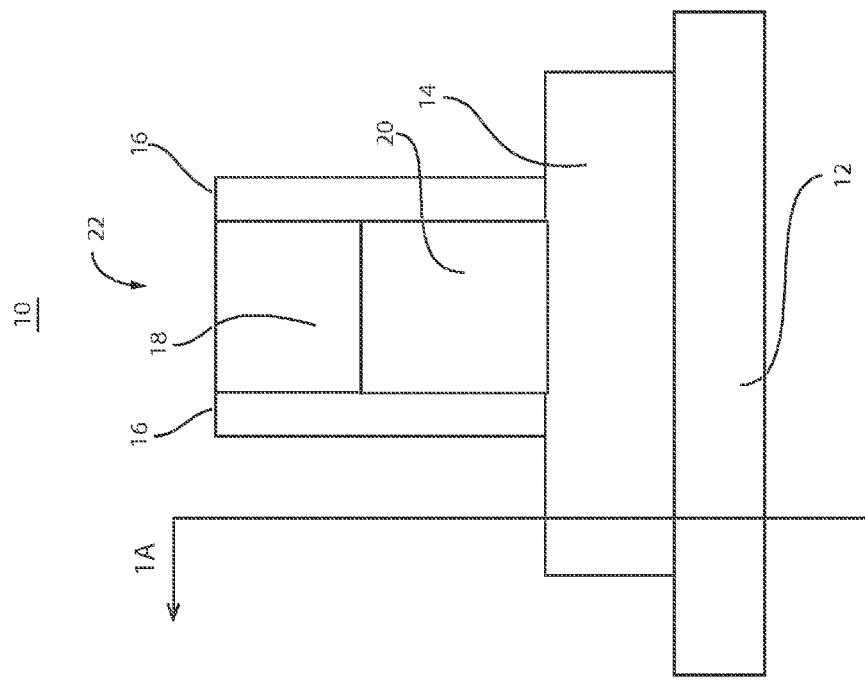
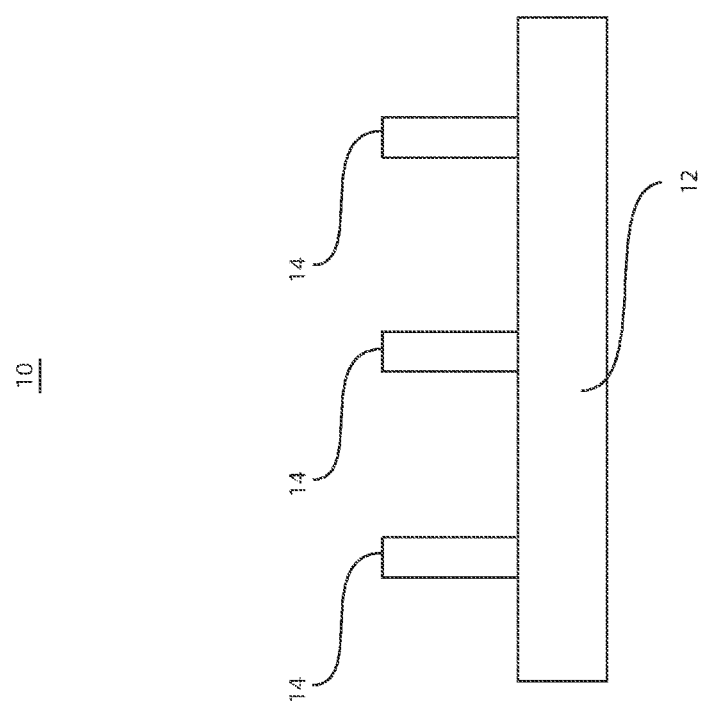

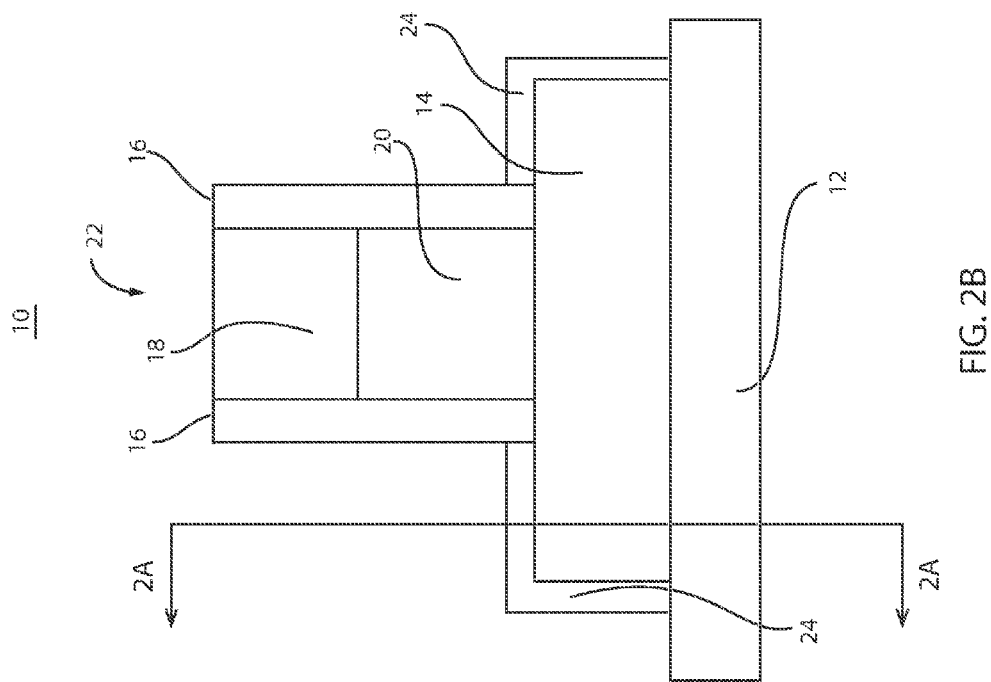
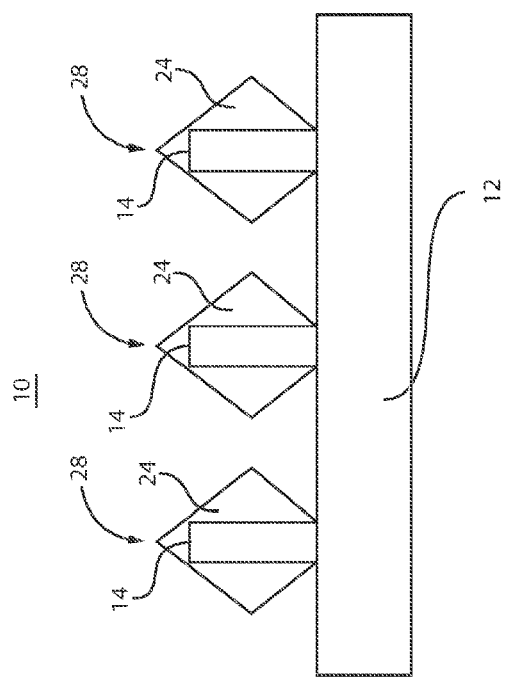
FIG. 2B
FIG. 2A

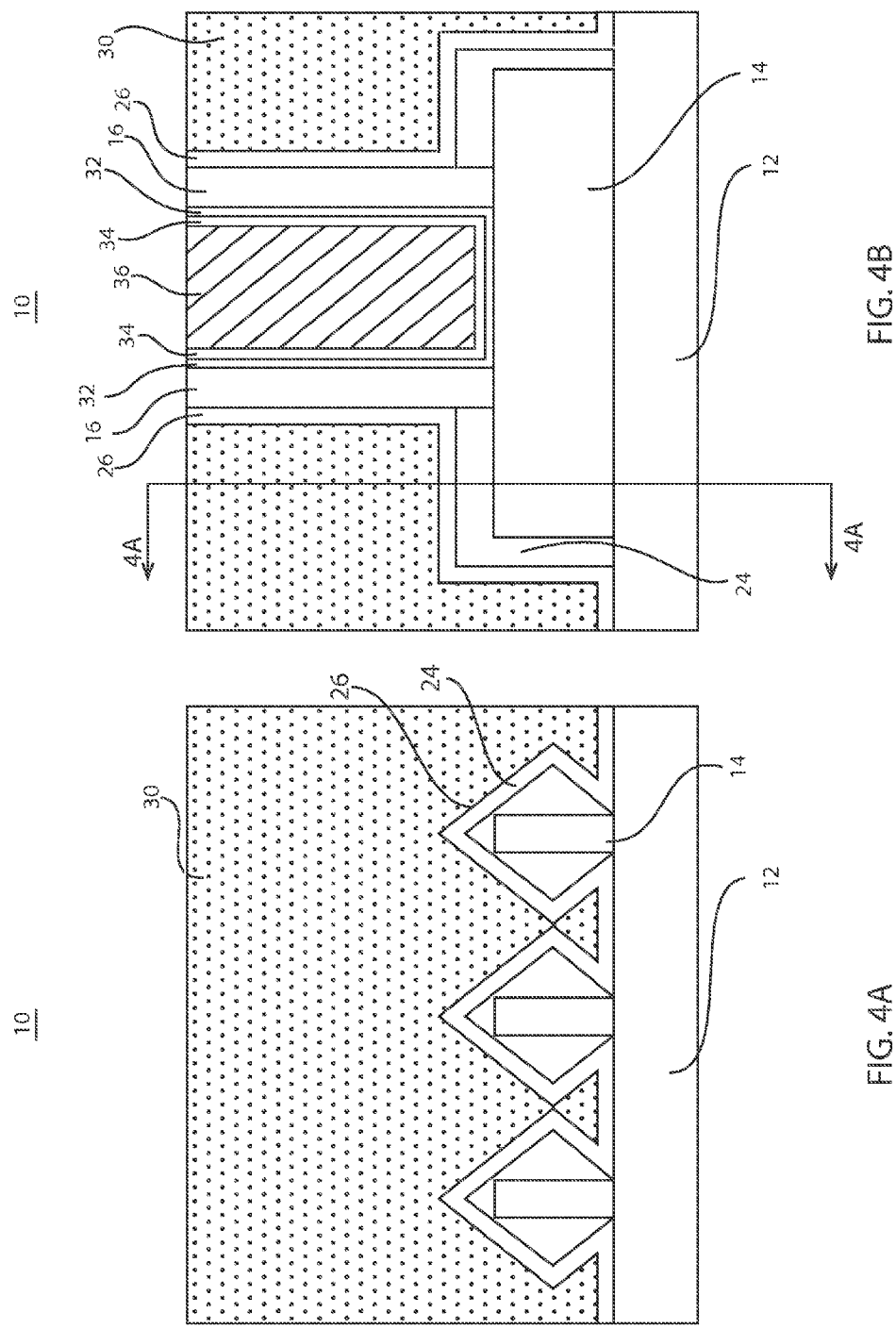

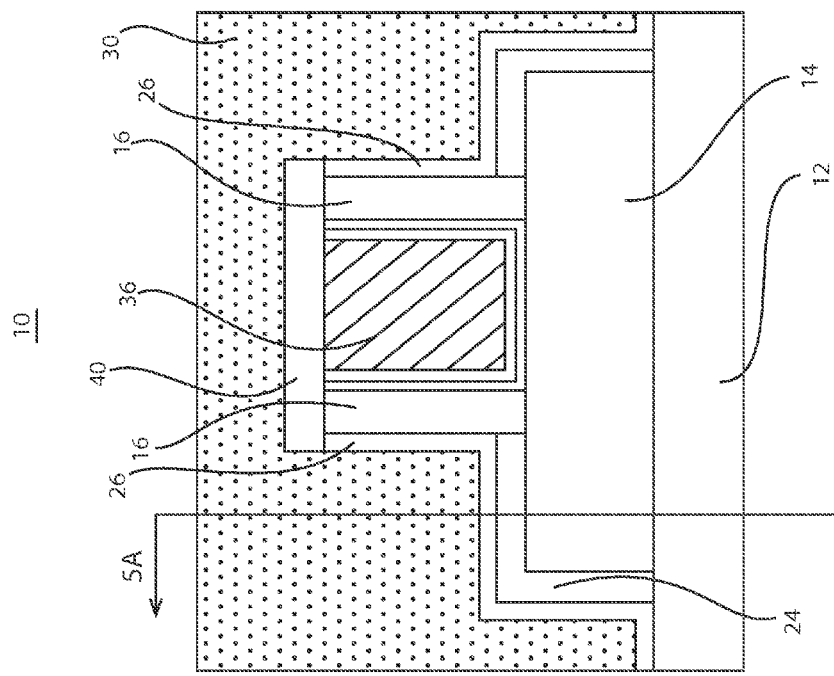
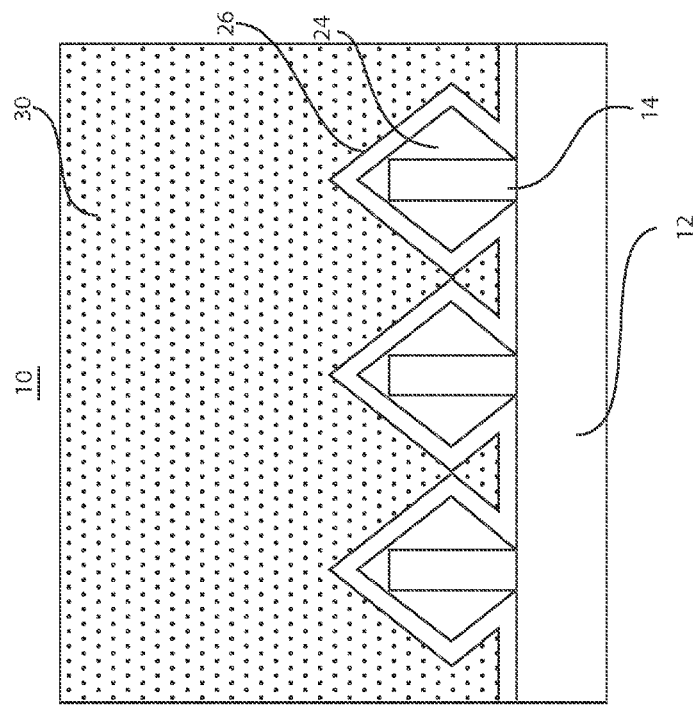
FIG. 5B
FIG. 5A

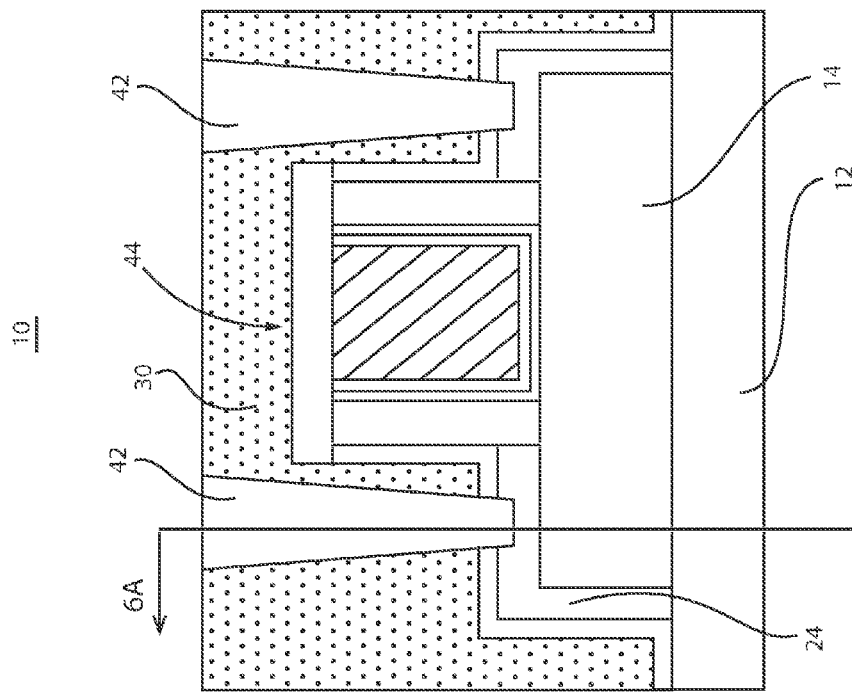
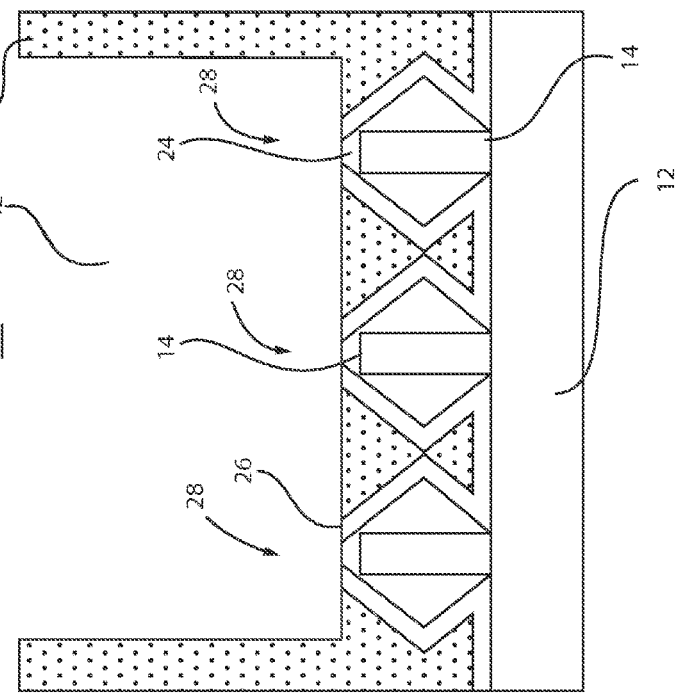
FIG. 6B
FIG. 6A

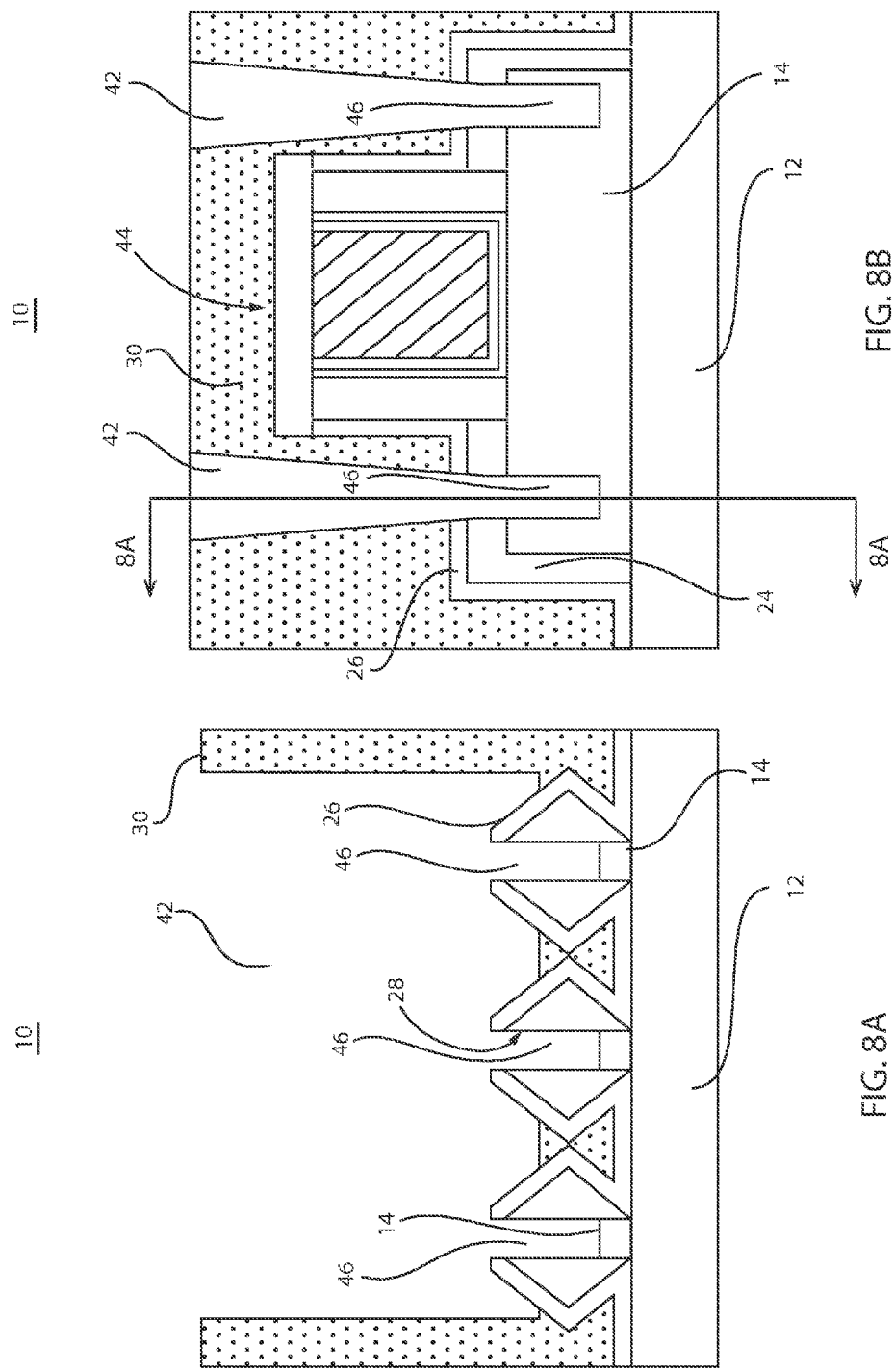

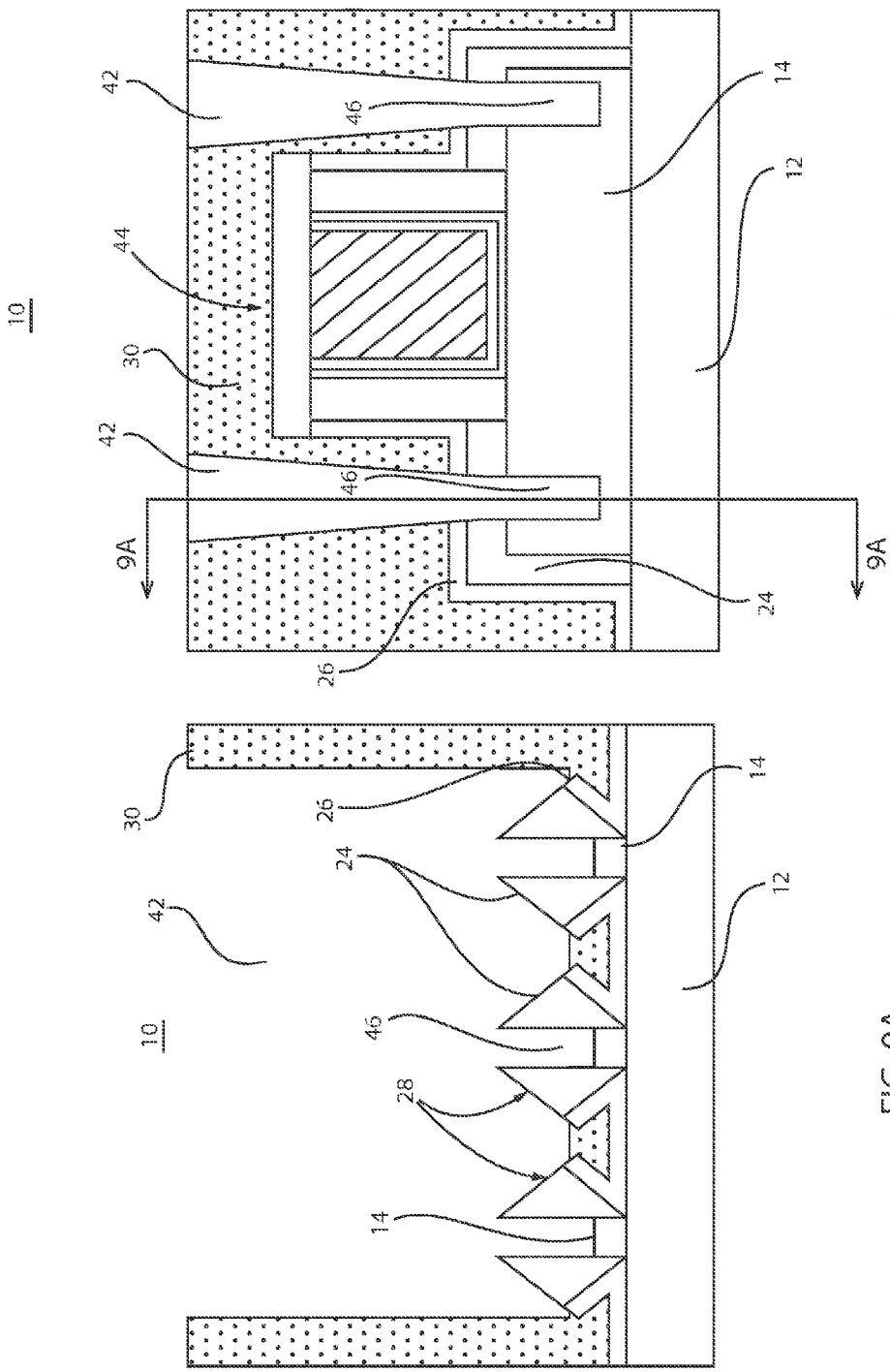

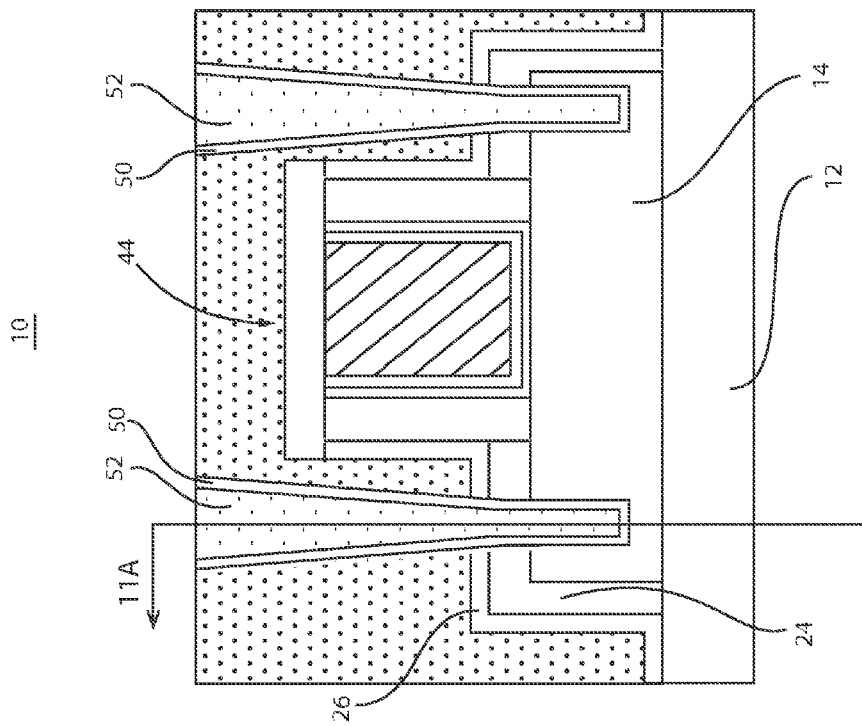
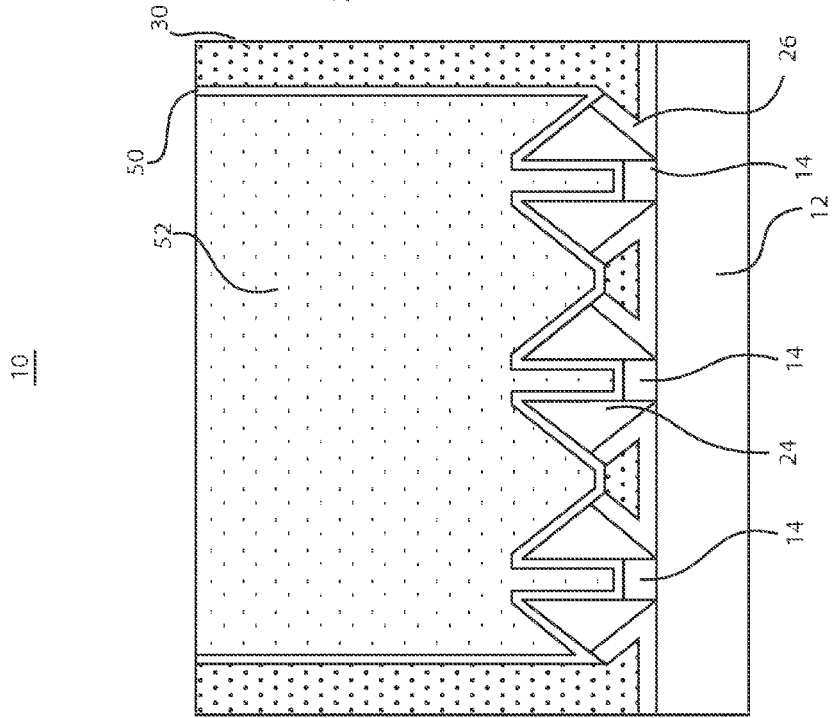

US 9,899,525 B2

INCREASED CONTACT AREA FOR FINFETS

PRIORITY CLAIM

This application is a divisional of U.S. application Ser. No. 14/794,997, filed Jul. 9, 2015, the entire contents of which are incorporated herein by reference.

BACKGROUND

Technical Field

The present invention relates to semiconductor processing, and more particularly to methods and structures that provide increased areas for contact between source and drain regions and their respective contacts.

Description of the Related Art

Silicon-on-insulator (SOI) fin field effect transistors (Fin-FETs) with unmerged epitaxially grown source and drain regions are usually associated with high contact resistance due to non-selective etch issues. The etching process for forming contact holes that penetrate into the source and drain (S/D) regions often etch away a portion of the highly conductive S/D regions and loss of contact area occurs. Even with a selective etch, the contact area is usually determined based upon how far the contact etch etches over the S/D regions. The S/D regions that are epitaxially grown on the fins often have a diamond-shaped cross-section and may be referred to as epi-diamonds.

SUMMARY

A first aspect of the disclosure provides a fin field effect transistor including: a gate structure formed on a fin; epitaxially grown source and drain (S/D) regions formed on the fin adjacent to the gate structure, the S/D regions including a diamond-shaped cross section wherein the diamond-shaped cross section includes: internal sidewalls where the fin was recessed to a reduced height, and an outer surface of the diamond-shaped cross section of the S/D regions; a contact liner formed over the internal sidewalls and an upper portion of the outer surface of the diamond-shaped cross section of the S/D regions; and contacts formed over the contact liner and over the internal sidewalls and the upper portion of the outer surface of the diamond-shaped cross section of the S/D regions.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 1A is a cross-sectional view of fins taken at section line 1A-1A in FIG. 1B;

FIG. 1B is a cross-sectional view of a fin field effect transistor (finFET) showing a dummy gate structure in accordance with the present principles;

FIG. 2A is a cross-sectional view of the fins taken at section line 2A-2A in FIG. 2B showing diamond shaped cross sections of source and drain (S/D) regions in accordance with the present principles;

FIG. 2B is a cross-sectional view of the finFET of FIG. 1B showing S/D regions formed in accordance with the present principles;

FIG. 4A is a cross-sectional view of the fins taken at section line 4A-4A in FIG. 4B showing a dielectric fill formed over the liner in accordance with the present principles;

FIG. 4B is a cross-sectional view of the finFET of FIG. 3B showing the dielectric fill formed over the liner and a replacement metal gate structure installed in accordance with the present principles;

FIG. 5A is a cross-sectional view of the fins taken at section line 5A-5A in FIG. 5B showing the dielectric fill formed over the liner in accordance with the present principles;

FIG. 5B is a cross-sectional view of the finFET of FIG. 4B showing the replacement metal gate structure recessed in accordance with the present principles;

FIG. 6A is a cross-sectional view of the fins taken at section line 6A-6A in FIG. 6B showing the dielectric fill opened to form contact openings and to expose a top portion of the diamond shaped cross sections of the S/D regions in accordance with the present principles;

FIG. 6B is a cross-sectional view of the finFET of FIG. 5B showing the dielectric fill opened to form contact openings in accordance with the present principles;

FIG. 8A is a cross-sectional view of the fins taken at section line 8A-8A in FIG. 8B showing the dielectric fill further recessed to expose more of the diamond shaped cross sections of the S/D regions in accordance with the present principles;

FIG. 8B is a cross-sectional view of the finFET of FIG. 7B showing the extended contact openings in accordance with the present principles;

FIG. 9A is a cross-sectional view of the fins taken at section line 9A-9A in FIG. 9B showing the liner removed from a top portion of the diamond shaped cross sections of the S/D regions in accordance with the present principles;

FIG. 9B is a cross-sectional view of the finFET of FIG. 8B showing the extended contact openings in accordance with the present principles;

FIG. 11A is a cross-sectional view of the fins taken at section line 11A-11A in FIG. 11B showing contact metal formed over the top portion and in the recesses of the diamond shaped cross sections of the S/D regions in accordance with the present principles;

FIG. 11B is a cross-sectional view of the finFET of FIG. 10B showing the contact metal formed in the extended contact openings in accordance with the present principles.

DETAILED DESCRIPTION

Figure 3B:
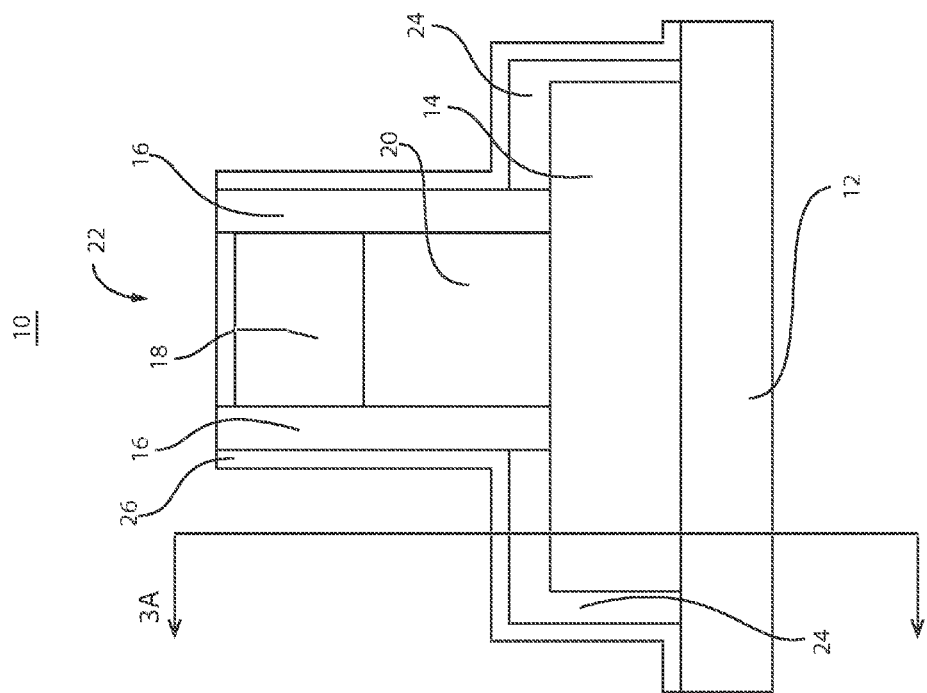
FIG. 3B is a cross-sectional view of the finFET of FIG. 2B showing the liner over the S/D regions formed in accordance with the present principles.

In accordance with the present principles, methods and structures are provided that increase contact area in fin field effect transistors (finFETs). In one embodiment, the etching process for exposing source and drain (S/D) region includes two separate process steps. A first step includes a timed etch designed to stop on top of epitaxially grown S/D regions. The S/D regions include diamond cross-sections so that a continued etch exposes a larger portion of a top of the diamonds. In a second step, a selective etch is performed to remove Si of the fins from a central portion of the diamonds. After the fin is recessed into the diamond step, a contact open etch is performed to open up the epitaxial material of the diamonds to maximize surface area or contact area once contacts are formed.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for an integrated circuit chip may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIGS. 1A and 1B, a partially fabricated semiconductor device 10 is shown in accordance with the present principles. FIG. 1A is a cross-section taken at section line 1A-1A of FIG. 1B. Device 10 includes a dielectric layer 12 that may include a buried oxide (BOX) of a silicon-on-insulator substrate. Fins 14 may be formed from a semiconductor layer of the SOI substrate. A dummy gate structure 22 (although a gate-first structure may also be employed) includes a dummy gate 20, spacers 16 and a cap layer 18. The dummy gate structures 20 may include amorphous Si or polysilicon (although other materials may be employed), the spacers 16 and the cap layer 18 may include silicon nitride (although other materials may be employed). The fins 14 may include monocrystalline Si, although other materials, such as SiGe, Ge, SiC, etc. may be employed.

Referring to FIGS. 2A and 2B, fins 14 are employed for epitaxially growing source and drain (S/D) regions 24. FIG. 2A is a cross-section taken at section line 2A-2A of FIG. 2B. The S/D regions 24 may include Si, SiGe, Ge, etc. The S/D regions 24 may be unmerged epitaxial S/D regions which have a different composition than the fin that they were grown on. The S/D regions 24 may be doped during formation using an in-situ doping process, although other doping processes may be employed. The epitaxial growth process results in a cross-section that is diamond-shaped for the S/D regions 24. The diamond-shaped epitaxial layer may be referred to herein as a diamond or a S/D diamond 28 for ease of reference.

Figure 3A:
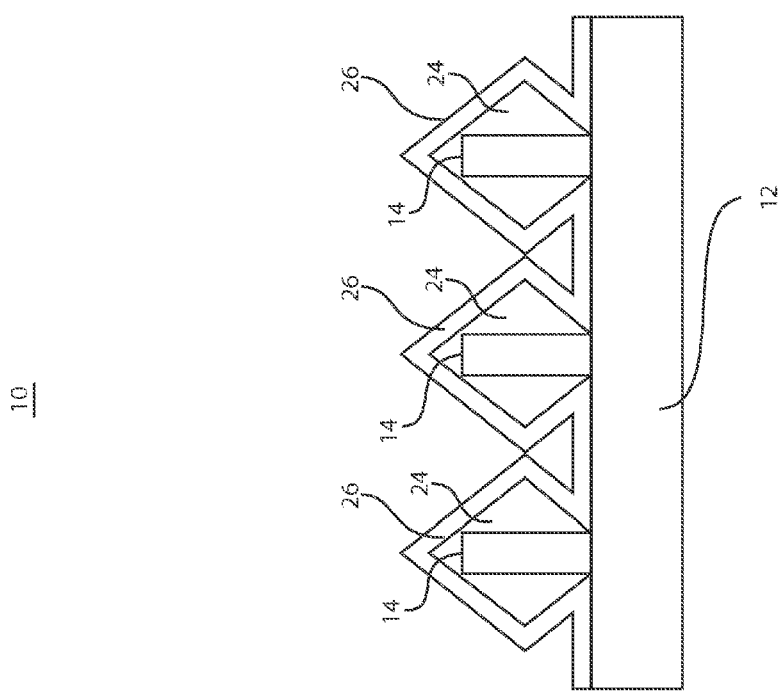
FIG. 3A is a cross-sectional view of the fins taken at section line 3A-3A in FIG. 3B showing a liner formed on the diamond shaped cross sections of the S/D regions in accordance with the present principles.

Referring to FIGS. 3A and 3B, a dielectric liner 26 is formed over surfaces of the device 10. The liner 26 may include SiN, although other materials may be employed. FIG. 3A is a cross-section taken at section line 3A-3A of FIG. 3B.

Referring to FIGS. 4A and 4B, FIG. 4A is a cross-section taken at section line 4A-4A of FIG. 4B. A replacement metal gate (RMG) process is performed. A dielectric fill 30 is employed to fill up spaces and gaps, followed by a planarizing step, e.g., a chemical mechanical polish (CMP). The dielectric fill 30 may include a flowable oxide. Next, the cap layer 18 and the dummy gate 20 are removed and replaced with a gate dielectric 32, a work function metal 34 and a gate conductor 36. Other configurations and materials are also possible. The gate dielectric 32 may include high-k dielectric materials, such as e.g., Hf02. The work function metal 34 may include Pt, Au, Ag, Cu, etc. The gate conductor 36 may include W, etc.

After the gate replacement process, a top surface of the device is planarized, by performing, e.g., CMP. Note that gate replacement is not necessary in a gate-first process where the gate structure is formed without the use of a dummy gate.

Referring to FIGS. 5A and 5B, the replacement gate metal is recessed and capped with a capping layer (gate cap) 40. A dielectric material (e.g., an oxide) is deposited to fill in gaps and spaces. A CMP process is performed to planarize a top surface of the device 10. Note that FIG. 5A is a cross-section taken at section line 5A-5A of FIG. 5B.

Referring to FIGS. 6A and 6B, FIG. 6A is a cross-section taken at section line 6A-6A of FIG. 6B. Contact holes or openings 42 are formed in the dielectric fill material 30 on sides of a gate structure 44. The contact openings 42 are formed by a first etch process that removes a large portion of the fill material 30 and exposes the diamonds 28 of the S/D regions 24. In one embodiment, the etch process may include a patterned reactive ion etch (RIE) process that employs an etch chemistry that removes all materials, e.g., oxide, nitrides and Si. This etch process may include a timed etch that removes material sufficient to open up the liner 26 and expose the material of the S/D regions 24.

Figure 7B:
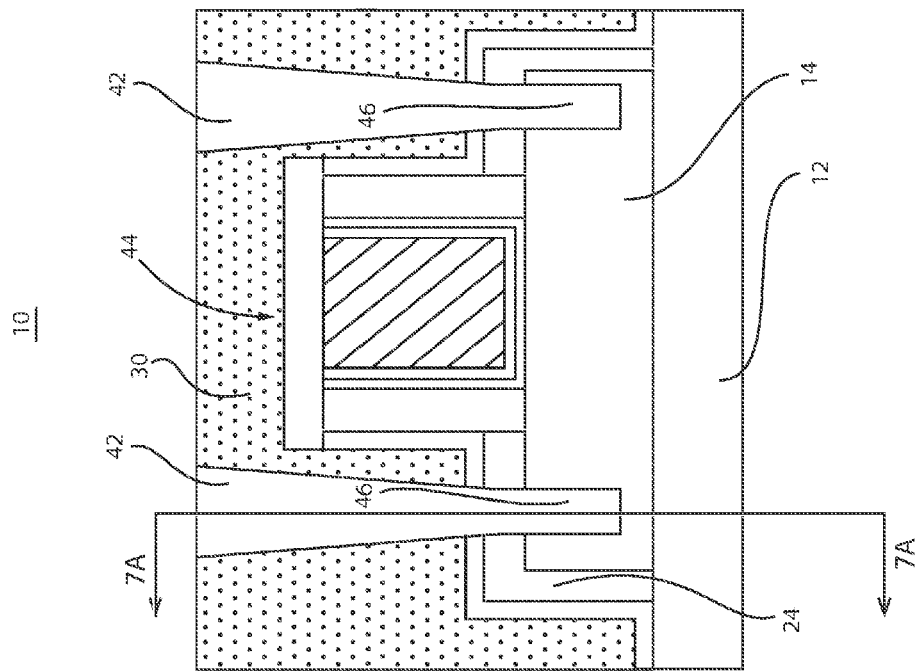
FIG. 7B is a cross-sectional view of the finFET of FIG. 6B showing the contact openings extended in accordance with the present principles.
Figure 7A:
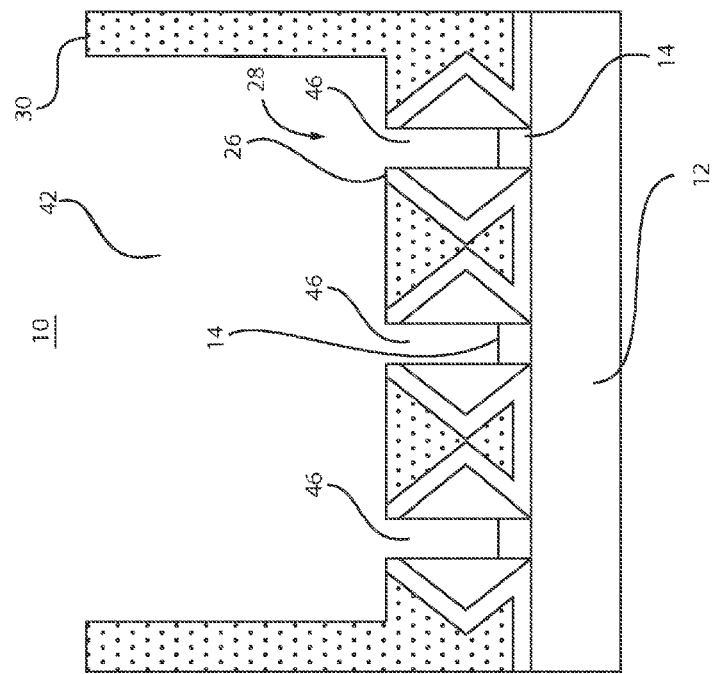
FIG. 7A is a cross-sectional view of the fins taken at section line 7A-7A in FIG. 7B showing fins recessed through the contact openings and into the diamond shaped cross sections of the S/D regions in accordance with the present principles.

Referring to FIGS. 7A and 7B, contact holes or openings 42 are extended into the fins 14 to form recesses 46. FIG. 7A is a cross-section taken at section line 7A-7A of FIG. 7B. The recesses 46 are formed by a second etch process that removes a portion of the fins 14 to open up a central portion (fins) in the diamonds 28 of the S/D regions 24. In one embodiment, the etch process may be a continuation of the first etch process (e.g., timed etch) by switching the etch chemistry. In another embodiment, the second etch process may be performed separately from the first etch process. The second etch process may include a selective etch to remove a portion of the fins 14 with minimal etching of oxides and nitrides, which act as mask materials to protect the diamonds 28 of the S/D regions 24. In one embodiment, the selective etch process includes an HBr chemistry for a RIE.

The recesses 46 formed preferably leave behind a sufficient portion of the fins 14 to provide adequate reduction for current-crowding effects. In one embodiment, the sufficient portion is less than about one half the height of the fin 14. In other embodiments, the recessed fin height is less than about 30% of its original height. In still other embodiments, the recessed fin height is less than about 20% of its original height.

Referring to FIGS. 8A and 8B, a continued etch is performed to further recess the dielectric fill 30 to expose a larger portion of the liner 26. FIG. 8A is a cross-section taken at section line 8A-8A of FIG. 8B. If the dielectric fill 30 includes oxide, the etch process is configured to remove oxide to expose the liner 26.

Referring to FIGS. 9A and 9B, another etch is performed to remove the liners 26 from top portions of the diamonds 28. FIG. 9A is a cross-section taken at section line 9A-9A of FIG. 9B. In one embodiment, the liner 26 includes silicon nitride and may be removed with a selective etch with respect to, e.g., Si and oxide. This etch leaves a multiple surface exposure of the epitaxially formed S/D regions 24. The exposed surface includes external diamond surfaces, and internal surfaces where the fins 14 were recessed.

Figure 10B:
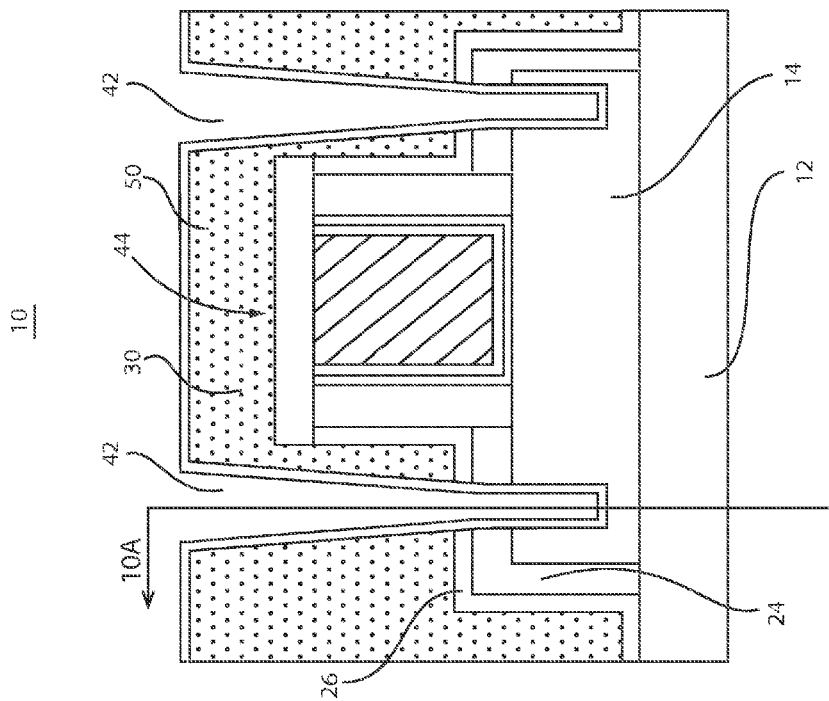
FIG. 10B is a cross-sectional view of the finFET of FIG. 9B showing the liner formed in the extended contact openings in accordance with the present principles.
Figure 10A:
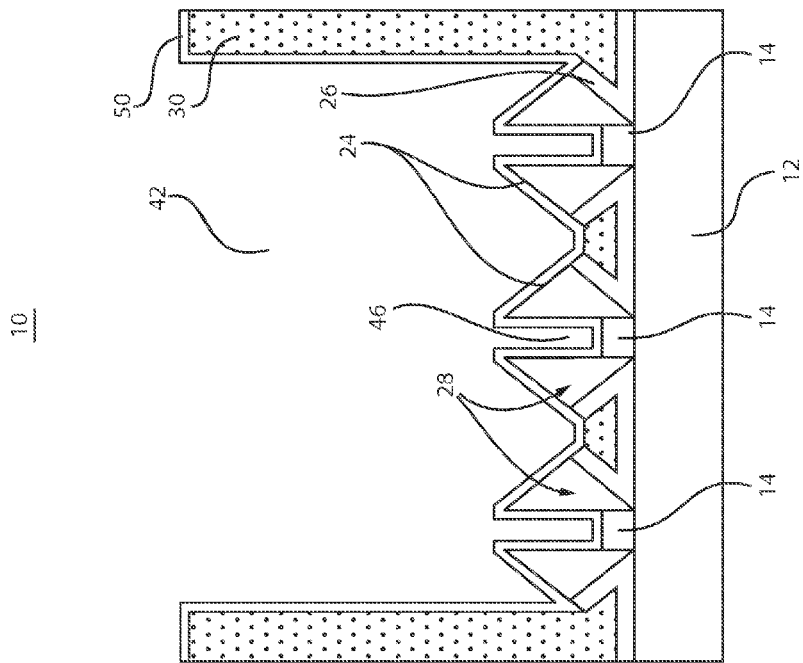
FIG. 10A is a cross-sectional view of the fins taken at section line 10A-10A in FIG. 10B showing a liner formed over the top portion and in the recesses of the diamond shaped cross sections of the S/D regions in accordance with the present principles.

Referring to FIGS. 10A and 10B, FIG. 10A is a cross-section taken at section line 10A-10A of FIG. 10B. A contact liner 50 is conformally formed in the contact holes 42, recesses 46 and over exposed portions of the S/D regions 24. The liner 50 may include Ti, TiN, TaN, or other materials. The liner 50 may be annealed to form a silicide with the S/D regions 24.

Referring to FIGS. 11A and 11B, FIG. 11A is a cross-section taken at section line 11A-11A of FIG. 11B. A conductor is formed over the liner 50. The conductor and the liner 50 are planarized, e.g., by CMP, to form contacts 52. The conductor may include a metal such as W, Cu, Al, etc. to form contacts 52. The contacts 52 follow multiple surfaces in contact with the liner 50 on the epitaxially formed S/D regions 24. The liner 50 surfaces include external diamond surfaces, and internal surfaces where the fins 14 were recessed.

Figure 12:
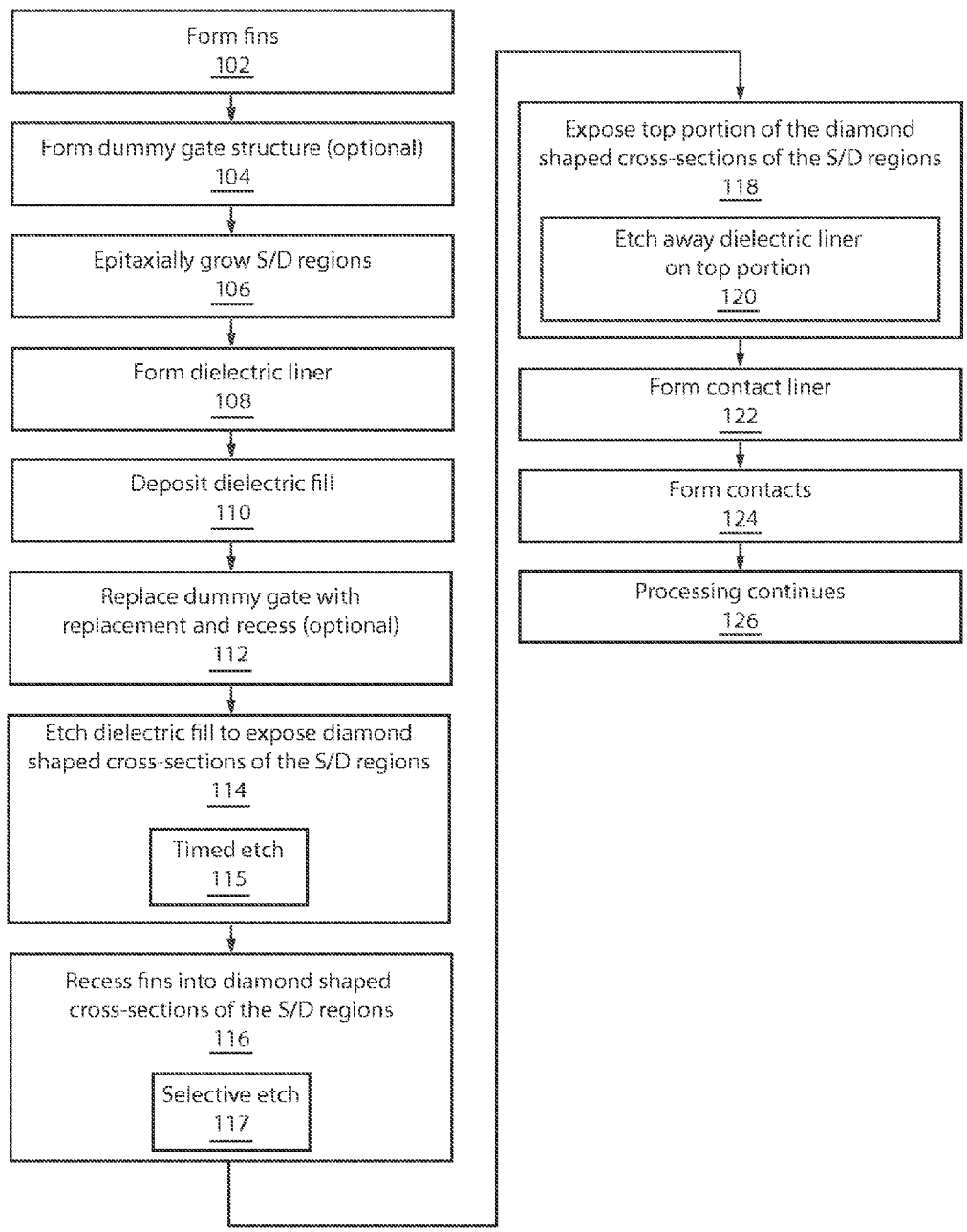
FIG. 12 is a block/flow diagram showing methods for forming a finFET in accordance illustrative embodiments.

Referring to FIG. 12, methods for forming fin field effect transistors are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, fins are formed on a substrate. In one embodiment, the fins may be formed in a silicon layer of a silicon-on-insulator (SOI) substrate, although other substrate configurations may be employed. In block 104, an optional dummy gate structure may be formed on the fins. Alternately, a gate-first process may be employed. In block 106, source and drain (S/D) regions are epitaxially grown on the fins. The S/D regions include a diamond-shaped cross section. In block 108, a dielectric liner is formed over the S/D regions. In block 110, a dielectric fill is deposited over the dummy gate structure and the S/D regions.

In block 112, an optional dummy gate replacement may be performed by replacing the dummy gate with a replacement metal gate structure and recessing the replacement metal gate structure.

In block 114, the dielectric fill over the S/D regions is etched to expose a top portion of the diamond-shaped cross section. The dielectric fill etch may include performing a timed etch in accordance with a pattern to reach the top portion of the diamond-shaped cross section in block 115. In block 116, the fins are recessed into the diamond-shaped cross section. The fin recess into the diamond-shaped cross section may include performing a selective etch to etch a portion of the fins within the diamond-shaped cross section in block 117. The selective etch may include a reactive ion etch with an HBr chemistry. Blocks 114 and 116 may include a same etch process with different chemistries at different times or may include two separate etch processes.

In block 118, a top portion of the diamond-shaped cross section of the S/D regions is exposed. In block 120, this may include etching away the dielectric liner from the top portion (e.g., exposing more of the top diamond facet surfaces).

In block 122, a contact liner is formed on the top portion of the diamond-shaped cross section of the S/D regions and in a recess where the fins were recessed. In block 124, contacts are formed over surfaces of the top portion and in the recess. The contacts may be formed over at least portions of top diamond surfaces (facets) and on exposed sidewalls in the recess where the fins were recessed. The recess where the fins were recessed may include at least one half an original fin height, although other amounts are contemplated, e.g., between 10% and 90% of the fin height. In block 126, processing continues to complete the device.

Having described preferred embodiments for increased contact area for finFETs (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A fin field effect transistor, comprising:
a gate structure formed on a fin;
epitaxially grown source and drain (S/D) regions formed on the fin adjacent to the gate structure, the S/D regions including a diamond-shaped cross section wherein the diamond-shaped cross section includes:
internal sidewalls where the fin was recessed to a reduced height, and
an outer surface of the diamond-shaped cross section of the S/D regions;
a contact liner formed over the internal sidewalls and an upper portion of the outer surface of the diamond-shaped cross section of the S/D regions; and
contacts formed over the contact liner and over the internal sidewalls and the upper portion of the outer surface of the diamond-shaped cross section of the S/D regions.

2. The transistor of claim 1, wherein the reduced height is at least one half of an original fin height.

3. The transistor of claim 1, wherein the reduced height is less than 30% of an original fin height.

4. The transistor of claim 1, wherein a dielectric liner directly contacts at least an entire lower portion of the outer surface of the diamond-shaped cross section of the S/D regions.

5. The transistor of claim 1, wherein a dielectric liner covers only a lower portion of the outer surface of the diamond-shaped cross section of the S/D regions.

6. The transistor of claim 1, wherein the contact liner is formed conformally only on an internal surface of the diamond-shaped cross section of the S/D regions, and on the upper portion of the outer surface of the diamond-shaped cross section of the S/D regions.

7. The transistor of claim 1, wherein the contact liner is in direct contact only with an internal surface of the diamond-shaped cross section of the S/D regions, and with the upper portion of the outer surface of the diamond-shaped cross section of the S/D regions.

8. The transistor of claim 1, wherein the S/D regions include unmerged epitaxial S/D regions.

* * * * *